United States Patent [19]

Ng

[11] Patent Number: 5,744,840
[45] Date of Patent: Apr. 28, 1998

[54] ELECTROSTATIC PROTECTION DEVICES FOR PROTECTING SEMICONDUCTOR INTEGRATED CIRCUITRY

[76] Inventor: Kwok Kwok Ng, 275 Garfield St., Berkeley Heights, N.J. 07922

[21] Appl. No.: 560,671

[22] Filed: Nov. 20, 1995

[51] Int. Cl.$^6$ .................................................. H01L 23/62
[52] U.S. Cl. ........................... 257/360; 257/361; 257/362
[58] Field of Search ................................. 257/360, 361, 257/362

[56] References Cited

U.S. PATENT DOCUMENTS

| 4,739,437 | 4/1988 | Morgan | 361/88 |
| 4,757,363 | 7/1988 | Bohm et al. | 257/361 |
| 4,829,350 | 5/1989 | Miller | 357/23.13 |
| 4,939,616 | 7/1990 | Rountree | 361/56 |
| 5,246,842 | 9/1993 | O'Brien et al. | 435/134 |
| 5,246,872 | 9/1993 | Mortensen | 437/51 |
| 5,426,320 | 6/1995 | Zambrano | 257/361 |
| 5,545,909 | 8/1996 | Williams et al. | 257/360 |

FOREIGN PATENT DOCUMENTS

| 63-66971 | 3/1988 | Japan | 257/362 |
| 2-230774 | 9/1990 | Japan | 257/362 |

OTHER PUBLICATIONS

"A Successful HBM EESD Protection Circuit for Micron and Sub–Micron Level CMOS", by B. G. Carbajal III et al., *EOS/ESD Symposium*, pp. 234–242.

"A Low–Voltage Triggering SCR for On–Chip ESD Protection at Output and Input Pads", by A. Chatterjee, *IEEE Electron Device Letters*, vol. 12, No. 1, Jan. 1991.

"ESD Reliability Impact of P+ Pocket Implant on Double Implanted NLDD MOSFET", by R. Consiglio et al., EOS/ESD Symposium 95–199, pp. 4.5.1–4.5.6.

*Primary Examiner*—Ngân V. Ngô

[57] ABSTRACT

Protecting device structures are disclosed for protecting one or more protected nodes of an integrated circuit to be protected against electrostatic discharges (ESD). Typically the integrated circuit includes n channel MOS transistors having terminals connected to the protected nodes. In a specific embodiment, the protecting device structure includes an MOS diode structure having source and drain regions and at least a pair of localized auxiliary region. Each of this pair of localized auxiliary regions has a conductivity type that is opposite from that of the source and drain regions. These localized auxiliary regions are located contiguous with the source and drain regions, respectively, and in the channel between the source and drain regions. The protecting device structure is integrated in the integrated circuit and has a terminal that is connected to a terminal of each of the one or more protected nodes of the integrated circuit.

34 Claims, 2 Drawing Sheets

5,744,840

ELECTROSTATIC PROTECTION DEVICES FOR PROTECTING SEMICONDUCTOR INTEGRATED CIRCUITRY

FIELD OF THE INVENTION

This invention relates to semiconductor integrated circuits and more particularly to device structures for protecting such circuits from electrostatic discharge ("ESD").

BACKGROUND OF INVENTION

Electrostatic discharge of transistors in semiconductor integrated circuits constitute well-known events, which destroy the transistors. To protect the transistors, various workers in prior art have suggested various protecting device structures, such as protecting diode structures. These protecting device structures are added to the circuit and are connected to one or more terminals of the protected transistor. In this way the protecting device structures protect the protected transistors against electrostatic discharge (ESD) events.

In U.S. Pat. No. 5,246,872, a protecting device structure is disclosed for protecting those and only those metal oxide semiconductor (MOS) transistors that have a lightly doped drain ("LDD"). The protecting device structure has a non-lightly doped drain ("non-LDD") transistor structure with its gate terminal ohmically connected to its source terminal, whereby the triggering voltage of this protecting device structure is less than those of the protected LDD MOS transistors. In this way, the protecting non-LDD device structure protects the protected MOS transistors, which have the LDD structures. Such a protecting device structure, however, would not protect a non-LDD MOS transistor very well, if at all, because of the equality of the respective triggering voltages of the protected MOS transistor and the protecting device structure. It would therefore be desirable to have a protecting device structure for protecting MOS transistors, including those that have non-LDD structures.

SUMMARY OF THE INVENTION

This invention provides, in a specific embodiment, an integrated circuit integrated in a semiconductor body and comprising:

(a) a protecting device structure for protecting first and second nodes of the integrated circuit, at least one of the nodes being coupled to a protected MOS transistor having localized source and drain regions of a first conductivity type, the protecting device structure being integrated at the major surface of the body and comprising a semiconductor diode MOS structure having a localized drain region, as well as a localized source region electrically connected to a gate electrode of the protecting device structure, and having first and second localized auxiliary regions of a second conductivity type opposite the first conductivity type, the first and second localized auxiliary regions being located contiguous with and between the localized source region and a localized drain region, respectively, of the protecting device structure; and (b) first wiring electrically connecting the localized source region of the protecting device structure to the first node of the integrated circuit;

(c) a first power supply terminal (typically VDD) of the integrated circuit;

(d) a second power supply terminal (typically VSS) of the integrated circuit; and (e) an input-output terminal of the integrated circuit.

Advantageously, second wiring electrically connects the localized drain region to the second node of the integrated circuit. The second node can be the second power supply terminal of the integrated circuit. Advantageously also, the first node is an input-output terminal of the integrated circuit.

Advantageously also, the localized source region, the localized drain region, and the first and second localized auxiliary regions of the protecting device structure are all located within a tub region. This tub region has a lower conductivity than that of the first and second localized auxiliary regions of the protecting device structure. The tub region has the second conductivity type and is located in a monocrystalline silicon substrate.

The nodes of the integrated circuit are connected to terminals of protected MOS transistors (source, drain, or gate terminals). Thus these MOS transistors are protected by the protecting device structure. Each of the thus protected MOS transistors can have a non-LDD structure or an LDD structure (a protected LDD structure being even better protected than a protected non-LDD structure). As mentioned above, the protecting MOS diode structure has a gate electrode, as does the ordinary MOS transistor structure, but the gate electrode of the protecting MOS diode structure is conductively connected to its source region.

The purpose of the auxiliary regions in the protecting device structure of this invention is to provide lower thresholds—i.e., lower triggering voltages. The purpose of the gate electrode is to create high fields in the protecting device structure. These high fields are created during the ESD events when, and only when, the protecting device structure is in its ON conditions caused by high drain voltages.

The protecting diode structure of this invention has been tested and found to produce a triggering voltage that is desirably lower than that produced by the protecting structure of the aforementioned patent. It is believed that the reason that the triggering voltage in the protecting structure of this invention is desirably lower is that a higher electric field is produced at the intersection of the drain and auxiliary regions at the surface of the structure. It is also believed that the current capacity of the protecting structure of this invention is relatively high because it includes a bulk semiconductor current. It should be recognized, however, that the actual success of the invention is not dependent upon the correctness of the theory.

In another specific embodiment, instead of or in addition to the first embodiment, an alternative embodiment of this invention involves an alternative protecting device structure. This alternative protecting device structure further comprises the protecting device structure further comprises (a) a third localized auxiliary region, having the second conductivity type, located within the tub region of the second conductivity type, and spaced apart from the localized source region on the opposite side of the localized source region from the localized drain region, (b) another tub region, having the first conductivity type, in which are located a fourth localized auxiliary region having the second conductivity type and a fifth localized auxiliary region having the first conductivity type, and (c) second wiring connecting the fourth localized auxiliary region to the second node.

When using this alternative protecting device structure, advantageously third wiring connects the fifth localized auxiliary region to the first power supply terminal of the integrated circuit. Advantageously also, fourth wiring connects the third localized auxiliary region to second power supply terminal of the integrated circuit. Advantageously also, the second node is the second power supply terminal of the integrated circuit. Advantageously also, the first node is an input-output terminal of the integrated circuit.

The protected MOS transistor can have a non-lightly doped drain structure.

The symbols $p^+$ and $n^+$ denote relatively strongly impurity doped p and n type semiconductive conductivity, respectively; the symbols p and n denote moderately impurity doped p and n type semiconductive conductivity, respectively; and the symbols $p^-$ and $n^-$ denote relatively lightly impurity doped p and n type semiconductive conductivity.

Only for the sake of clarity, none of the drawings is to any scale.

DETAILED DESCRIPTION

Figure 1:
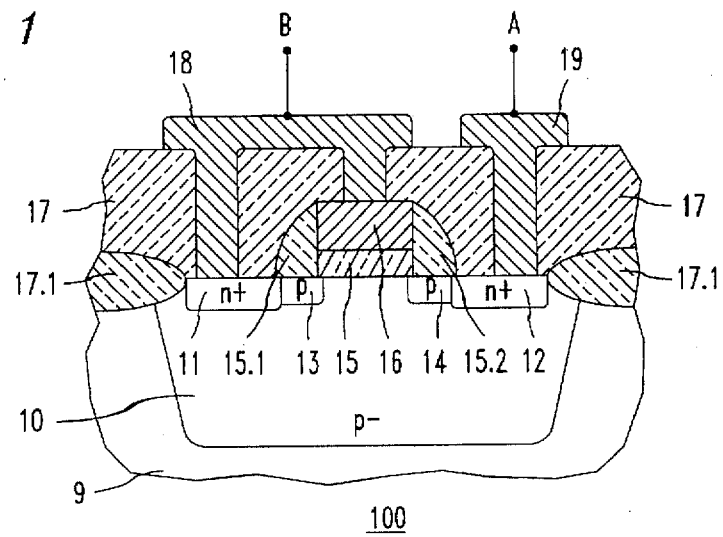
FIG. 1 is a cross-sectional elevation view of a protecting device structure, according to a specific embodiment of the invention.

An integrated circuit 300 (FIG. 3) has a plurality of nodes A and B that are protected. As shown in FIG. 1, a protecting diode device structure 100 (hereinafter: simply "the structure 100") is integrated in the circuit 300. The diode device structure 100 comprises a substrate region 9, having moderate p or moderate n type conductivity, in which a tub region 10 typically having $p^-$ type conductivity has been formed. An MOS-type diode is formed by $n^+$ (i.e., strongly n type conductivity) localized source and drain regions 11 and 12, respectively, in combination with polysilicon gate electrode 16. This polysilicon gate electrode 16 is spaced apart from a top major surface of the substrate region 10 by a relatively thin gate oxide layer 15, as known in the art. Spacer sidewall layers 15.1 and 15.2, typically made of silicon dioxide, are located on repective sidewalls of the polysilicon gate electrode 16 and of the gate oxide layer 15.

Direct electrically conductive connection between the localized source region 11 and the polysilicon gate electrode 16 is made by a source-gate metallic contact 18, typically comprising aluminum, through windows in a relatively thick oxide layer 17, also as known in the art. Electrical contact to the localized drain region 12 is made by a metallic contact 19, likewise typically comprising aluminum, through another window in the relatively thick oxide layer 17, also as known in the art.

The left-hand edge and the right-hand edge of the localized source and drain regions 11 and 12, respectively are contiguous with field oxide layers 17.1, as known in the art. A major purpose of the field oxide layers 17.1 is to confine the extent of the localized source and drain regions 11 and 12, also as known in the art.

Located contiguous with the major surface of the substrate region 10, as well as contiguous with and between the source and drain regions 11 and 12, respectively, is a pair of doped localized auxiliary regions 13 and 14, both having moderate p type conductivity. Thus the conductivity type of the doped localized auxiliary regions 13 and 14 is opposite to that of the localized source and drain regions 11 and 12.

Figure 3:
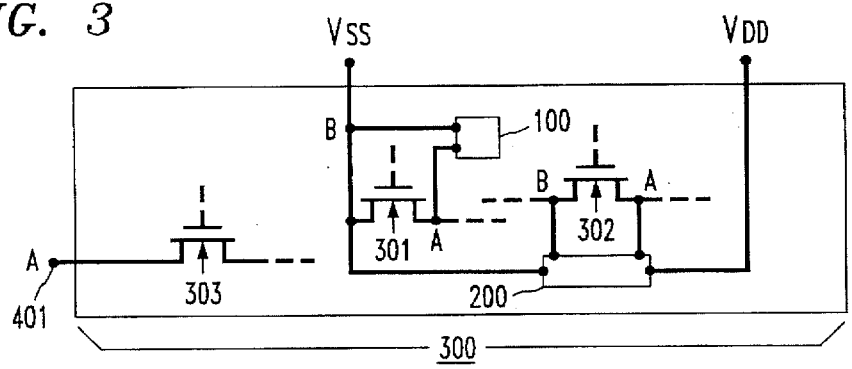
FIG. 3 is a circuit schematic showing connections of the protecting device structures to the circuit to be protected.

As shown in FIG. 3, during electrical operations, power is supplied to the integrated circuit 300 through power supply terminals VDD and VSS. The power supplied to the terminal VDD has a voltage that is typically the highest power supply voltage of the integrated circuit 300, and the power supplied to the terminal VSS is typically substrate ground of the integrated circuit 300. The metallic contact 18 of the structure 100 is electrically connected to one or more nodes B of the integrated circuit 300, these one or more nodes B being selected for being protected by the structure 100. The metallic contact 19 of the structure 100 is electrically connected to one or more nodes A of the integrated circuit 300, these one or more nodes A being selected for being protected by the structure 100.

As further shown in FIG. 3, the node B can be a terminal of the integrated circuit 300 to which is connected the power supply terminal VSS. The node A can be the drain terminal of an exemplary non-lightly doped drain structures n channel MOS transistor 301 whose source terminal is directly connected to the power supply terminal VSS. The node A can also be an input-output terminal 401 of the integrated circuit 300. This input-output terminal 401 is connected typically to the drain terminal of another exemplary n channel MOS transistor 303 of the integrated circuit 300.

Figure 2:
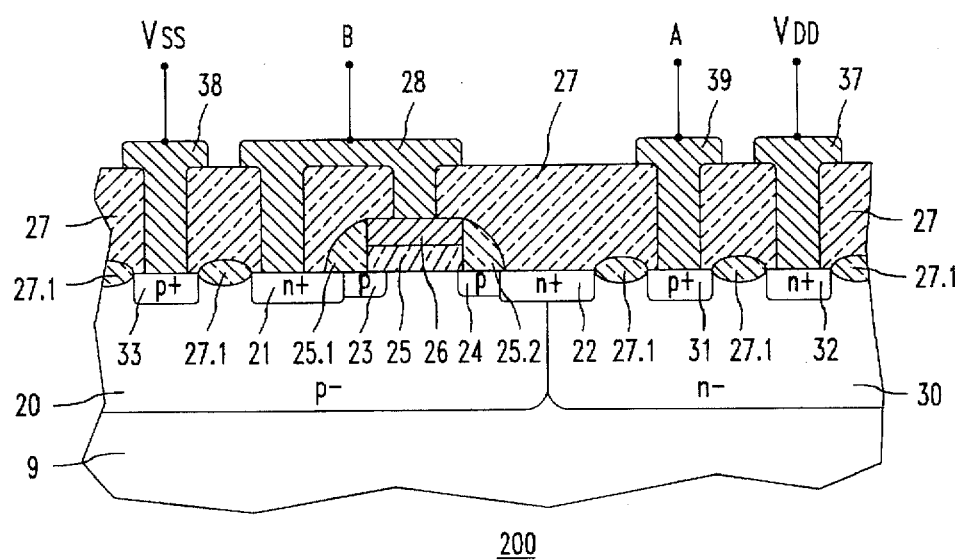
FIG. 2 is a cross-sectional elevation view of a protecting device structure, according to another specific embodiment of the invention.

As shown in FIG. 2, an alternative protecting device structure 200 (hereinafter: simply "the structure 200") is integrated in the integrated circuit 300 instead of, or in addition to, the protecting device structure 100. As shown, this structure 200 protects nodes that are directly connected to yet another exemplary transistor 302 of the integrated circuit 300.

As further shown in FIG. 3, the structure 200, as well as the structure 100, can protect any other nodes A and B of the integrated circuit 300. Again, node B can be the power supply terminal VSS, and node A can be the input-output terminal 401 of the integrated circuit 300. The exemplary transistors 301, 302, and 303 are typically LDD. n channel MOS transistors. However, some or all of the exemplary transistors 301, 302, and 303 can be non-LDD n channel MOS transistors—the LDD transistors being protected even better by the protecting structure 100 than the non-LDD n channel MOS transistors. That is to say, the difference in triggering voltage between each of the LDD transistors and the protecting device structure will be larger than that of the non-LDD transistors.

In FIG. 2, elements that are similar to, or the same as, elements described above concerning the structure 100 (FIG. 1) are denoted by the same reference numbers plus ten. The structure 200 thus comprises an MOS diode structure formed by n type localized source and drain regions 21 and 22, together with p type conductivity localized auxiliary regions 23 and 24, gate oxide layer 33, polysilicon gate electrode 26, field oxide 27, and source-gate metallic contact 28. This metallic contact 28 is connected to one or more nodes B of the integrated circuit 300.

Located in the $p^-$ conductivity type tub region 20 is an added localized auxiliary region 33 having $p^+$ type conductivity. This added localized auxiliary region 33 is located contiguous with the top major surface of the tub 20 on the opposite of the source region 21 from that of the channel (that runs between the source and drain regions 21 and 22). A metallic contact 38 contacts this localized auxiliary region 33 and is connected to the power supply terminal VSS of the integrated circuit 300.

In addition, the structure 200 has an n⁻ conductivity type tub region 30 in which is located another localized auxiliary region 31, having p⁺ type conductivity. This localized auxiliary region 31 is located contiguous with the top major surface of the tub 30 and is spaced apart from the localized drain region 22. A metallic contact 39 contacts this localized auxiliary region 31 and is connected to one or more nodes A of the integrated circuit 300. The localized n⁺ conductivity type region 22 is located partly in the tub region 20 and partly in the n⁻ conductivity type tub region 30.

In the n⁻ type conductivity tub region 30 is located yet another localized auxiliary region 32, contiguous with the top major surface of the tub 30 and having n⁺ type conductivity. This localized auxiliary region 32 is spaced apart from the localized auxiliary region 31 and is located on the other side of the localized auxiliary region 31 . from the localized drain region 22. A metallic contact 37 contacts the localized auxiliary region 32 and is connected to the power supply terminal VDD of the integrated circuit 300.

The localized regions 33, 21, 31, and 32 in the structure 200 form a pnpn silicon controlled rectifier ("SCR"). Therefore, the structure 200 tends to have a larger current capacity than does the structure 100 because of the inherent feedback of silicon controlled rectifiers. The more simple MOS diode structure 100 (FIG. 1) lacks this feedback mechanism.

Figure 4:
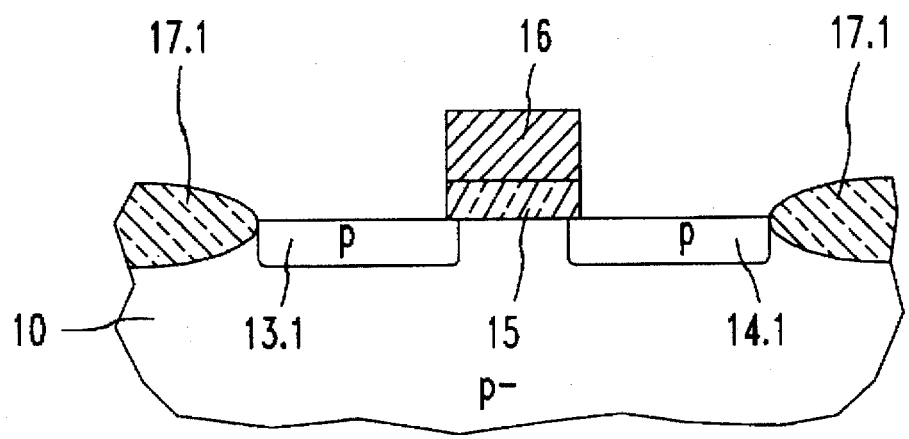
FIG. 4 is a cross-sectional elevation view of a protecting device structure in an early phase of its fabrication, according to a specific embodiment of the invention in a subsequent phase of its fabrication.
Figure 5:
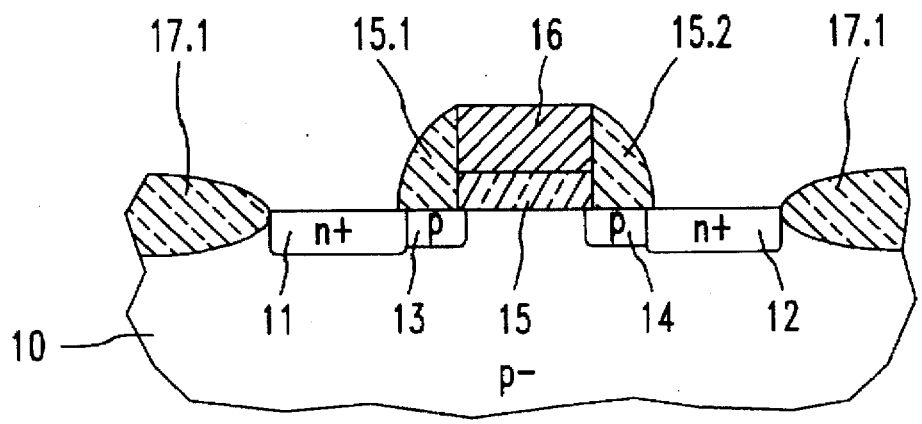
FIG. 5 is a cross-sectional elevation view of a protecting device structure, according to a specific embodiment of the invention.

As shown in FIG. 4, at an early stage in the fabrication of the structure 100 field oxide layers 17.1 are formed, typically by use of standard fabrication processing techniques. The gate oxide layer 15 and the polysilicon gate electrode 16 also are formed typically by use of standard fabrication processing techniques. Then, using the gate oxide layer 15 and the polysilicon gate electrode 16 as a mask against implantation of impurities, a pair of moderately doped p type regions 13.1 and 14.1 are formed, again using standard processes. Next, spacer sidewall layers 15.1 and 15.2 (FIG. 5) are formed on the sidewalls of the gate oxide 15 and the polysilicon gate electrode 16, again using standard processes. Typically the spacer sidewall layers 15.1 and 15.2 are silicon dioxide. Finally, using these spacer sidewall layers 15.1 and 15.2, as well as the field oxide layers 17.1, as masks against implantation of impurities, the (strongly doped) n⁺ regions 11 and 12 are formed, again using standard processes.

Although the invention has been disclosed in terms of specific embodiments, various modifications can be made without departing from the scope of the invention. For example, the protecting structures 100 and 200 can protect nodes connected to terminals of p channel MOS transistors. Alternatively, the p and n type conductivities can be interchanged everywhere, to protect nodes connected to terminals of p channel MOS transistors. The localized auxiliary regions 32 and 33 of the structure 200 higher than the highest and lower than lowest power supplies (VDD and VSS), respectively, of the integrated circuit 300. The protected nodes A and B can be located anywhere in integrated circuit 300, including a gate terminal of an MOS transistor. The localized auxiliary regions 33 and 32 of the structure 200 can be connected to power supply terminals.

What is claimed is:

1. An integrated circuit comprising:
   (a) a protecting device structure for protecting first and second nodes of the integrated circuit, at least one of the nodes being conductively coupled to a terminal of a protected MOS transistor having localized source and drain regions, the protecting device structure comprising a semiconductor diode structure having localized source and localized drain regions of a first conductivity type, and having first and second localized auxiliary regions of a second conductivity type opposite the first conductivity type, the first and second localized auxiliary regions being located contiguous with and between the localized source region and the localized drain region, respectively, of the protecting device structure; and (b) first wiring electrically connecting the localized source region of the protecting device structure to the first node of the integrated circuit;

(c) a first power supply terminal of the integrated circuit;

(d) a second power supply terminal of the integrated circuit; and (e) an input-output terminal of the integrated circuit.

2. The integrated circuit of claim 1 further comprising second wiring electrically connecting the localized drain region to the second node of the integrated circuit.

3. The integrated circuit of claim 1 in which the second node is the second power supply terminal of the integrated circuit.

4. The integrated circuit of claim 3 further comprising second wiring electrically connecting the localized drain region to the second node of the integrated circuit.

5. The integrated circuit of claim 1 in which the first node is an input-output terminal of the integrated circuit.

6. The integrated circuit of claim 5 further comprising second wiring electrically connecting the localized drain region to the second node of the integrated circuit.

7. The integrated circuit of claim 1 in which the localized source region, the localized drain region, and the first and second localized auxiliary regions of the protecting device structure are all located within a tub region having a lower conductivity than that of the first and second localized auxiliary regions of the protecting device structure, the tub region having the second conductivity type and being located in a monocrystalline silicon substrate.

8. The integrated circuit of claim 1 in which the first conductivity type is n type.

9. The integrated circuit of claim 7 in which the protecting device structure further comprises
   (a) a third localized auxiliary region, having the second conductivity type, located within the tub region of the second conductivity type, and spaced apart from the localized source region on the opposite side of the localized source region from the localized drain region,
   (b) another tub region, having the first conductivity type, in which are located a fourth localized auxiliary region having the second conductivity type and a fifth localized auxiliary region having the first conductivity type, and
   (c) second wiring connecting the fourth localized auxiliary region to the second node.

10. The integrated circuit of claim 9 further comprising third wiring connecting the fifth localized auxiliary region to the first power supply terminal of the integrated circuit.

11. The integrated circuit of claim 10 further comprising fourth wiring connecting the third localized auxiliary region to second power supply terminal of the integrated circuit.

12. The integrated circuit of claim 11 in which the second node is the second power supply terminal of the integrated circuit.

13. The integrated circuit of claim 12 in which the first node is an input-output terminal of the integrated circuit.

14. The integrated circuit of claim 9 further comprising third wiring connecting the third localized auxiliary region to second power supply terminal of the integrated circuit.

15. The integrated circuit of claim 14 in which the second node is the second power supply terminal of the integrated circuit.

16. The integrated circuit of claim 15 in which the first node is an input-output terminal of the integrated circuit.

17. The integrated circuit of claim 16 further comprising third wiring connecting the third localized auxiliary region to second power supply terminal of the integrated circuit.

18. The integrated circuit of claim 17 in which the second node is the second power supply terminal of the integrated circuit.

19. The integrated circuit of claim 18 in which the first node is an input-output terminal of the integrated circuit.

20. The integrated circuit of claim 9 in which the second node is the second power supply terminal of the integrated circuit.

21. The integrated circuit of claim 20 in which the first node is an input-output terminal of the integrated circuit.

22. The integrated circuit of claim 9 in which the first node is an input-output terminal of the integrated circuit.

23. The integrated circuit of claim 1 in which a p-n junction is formed at an intersection of the second localized auxiliary region and the localized drain region, the p-n junction extending to the major surface.

24. The integrated circuit of claim 1 in which the terminal of the protected MOS transistor is conductively coupled to the drain region of the protected MOS transistor.

25. An integrated circuit comprising:
a protecting device structure for protecting first and second nodes of the integrated circuit, at least one of the nodes being conductively coupled to a terminal of a protected MOS transistor having localized source and drain regions,
the protecting device structure comprising a semiconductor diode structure integrated in a semiconductor body having a major surface, and the protecting device structure having localized source and localized drain regions of a first conductivity type, and the protecting device structure further having first and second localized auxiliary regions of a second conductivity type opposite the first conductivity type, the first and second localized auxiliary regions being located contiguous with and between the localized source region and the localized drain region, respectively, of the protecting device structure,
the protecting device structure further having an insulating layer located contiguous with the major surface,
each of the first and second localized auxiliary regions having a separate end portion that is located contiguous with the insulating layer at separate first and second end regions thereof, the insulating layer running contiguous with the major surface from the end portion of the first localized auxiliary region to the end portion of the second localized auxiliary region.

26. The integrated circuit of claim 25 in which a p-n junction is formed at n intersection of the second localized auxiliary region and the localized drain region, the p-n junction extending to the major surface.

27. The integrated circuit of claim 26 further comprising:
(a) first wiring electrically connecting the localized source region of the protecting device structure to the first node of the integrated circuit;
(b) a first power supply terminal of the integrated circuit;
(c) a second power supply terminal of the integrated circuit; and
(d) an input-output terminal of the integrated circuit.

28. The integrated circuit of claim 27 in which the terminal of the protected MOS transistor is conductively coupled to the drain region of the protected MOS transistor.

29. An integrated circuit comprising:
a protecting device structure for protecting first and second nodes of the integrated circuit, at least one of the nodes being conductively coupled to a terminal of a protected MOS transistor having localized source and drain regions,
the protecting device structure comprising a semiconductor diode structure integrated in a Semiconductor body having a major surface, and the protecting device structure having localized source and localized drain regions of a first conductivity type, and the protecting device structure further having first and second localized auxiliary regions of a second conductivity type opposite the first conductivity type, the first and second localized auxiliary regions being located contiguous with and between the localized source region and the localized drain region, respectively, of the protecting device structure,
the protecting device structure further having an insulating layer located contiguous with the major surface, the localized drain region having a portion that is contiguous with the insulating layer.

30. The integrated circuit of claim 29 further comprising:
(a) first wiring electrically connecting the localized source region of the protecting device structure to the first node of the integrated circuit;
(b) a first power supply terminal of the integrated circuit;
(c) a second power supply terminal of the integrated circuit; and
(d) an input-output terminal of the integrated circuit.

31. The integrated circuit of claim 30 in which the terminal of the protected MOS transistor is conductively coupled to the drain region of the protected MOS transistor.

32. An integrated circuit comprising:
a protecting device structure for protecting first and second nodes of the integrated circuit, at least one of the nodes being conductively coupled to a terminal of a protected MOS transistor having localized source and drain regions,
the protecting device structure comprising a semiconductor diode structure integrated in a semiconductor body having a major surface, and the protecting device structure having localized source and localized drain regions of a first conductivity type, and the protecting device structure further having first and second localized auxiliary regions of a second conductivity type opposite the first conductivity type, the first and second localized auxiliary regions being located contiguous with and between the localized source region and the localized drain region, respectively, of the protecting device structure,
the doping level of the localized drain region being moderate, and the doping level of the second localized auxiliary region being strong.

33. The integrated circuit of claim 32 further comprising:
(a) first wiring electrically connecting the localized source region of the protecting device structure to the first node of the integrated circuit;
(b) a first power supply terminal of the integrated circuit;
(c) a second power supply terminal of the integrated circuit; and
(d) an input-output terminal of the integrated circuit.

34. The integrated circuit of claim 33 in which the terminal of the protected MOS transistor is conductively coupled to the drain region of the protected MOS transistor.

* * * * *